(12) United States Patent
Wu et al.

(10) Patent No.: US 12,085,849 B2
(45) Date of Patent: Sep. 10, 2024

(54) BAKING CHAMBER WITH SHROUD FOR MASK CLEAN

(71) Applicant: Applied Materials, Inc., Santa Clara, CA (US)

(72) Inventors: Banqiu Wu, San Jose, CA (US); Khalid Makhamreh, Los Gatos, CA (US); Eliyahu Shlomo Dagan, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 749 days.

(21) Appl. No.: 17/229,584

(22) Filed: Apr. 13, 2021

(65) Prior Publication Data

US 2022/0326608 A1 Oct. 13, 2022

(51) Int. Cl.
G03F 1/82 (2012.01)
B08B 7/00 (2006.01)
H05B 3/22 (2006.01)

(52) U.S. Cl.
CPC .............. *G03F 1/82* (2013.01); *B08B 7/0078* (2013.01); *H05B 3/22* (2013.01)

(58) Field of Classification Search
CPC ... G03F 1/82; B08B 7/0078; H05B 2203/032; H05B 3/22
See application file for complete search history.

(56) References Cited

U.S. PATENT DOCUMENTS

| | | | |
|---|---|---|---|
| 6,033,474 A | 3/2000 | Mita et al. | |
| 6,707,011 B2 | 3/2004 | Tay et al. | |
| 7,150,628 B2 * | 12/2006 | Yamaga | H01L 21/67109 432/247 |
| 2002/0034714 A1 * | 3/2002 | Deguchi | B05D 3/0209 118/724 |
| 2003/0013280 A1 | 1/2003 | Yamanaka | |
| 2005/0205007 A1 | 9/2005 | Rolfson | |

(Continued)

FOREIGN PATENT DOCUMENTS

| | | | |
|---|---|---|---|
| JP | 2011099956 A | 5/2011 | |
| KR | 10-2004-0067561 A | 7/2004 | |
| KR | 102324405 B1 * | 11/2021 | H01L 21/68785 |

OTHER PUBLICATIONS

International Search Report for PCT/US2022/024327, dated Aug. 2, 2022.

*Primary Examiner* — Nathaniel E Wiehe
*Assistant Examiner* — Dilnessa B Belay
(74) *Attorney, Agent, or Firm* — MOSER TABOA

(57) ABSTRACT

Embodiments of baking chambers are provided herein. In some embodiments, a baking chamber for baking a substrate includes: a chamber body enclosing an interior volume; a heater disposed in the interior volume, wherein the heater is configured to have a surface temperature of about 100 to about 400 degrees Celsius during use; a shroud disposed in the interior volume opposite the heater, wherein the shroud includes a central opening fluidly coupled to a gas inlet; a plurality of substrate lift pins configured to support a substrate in the interior volume between the heater and the shroud, wherein the shroud includes a plurality of first openings to facilitate the plurality of substrate lift pins; and a gas outlet disposed in the chamber body opposite the shroud such that a gas flow path through the interior volume extends from the gas inlet, around the heater, and to the gas outlet.

19 Claims, 5 Drawing Sheets

(56) References Cited

U.S. PATENT DOCUMENTS

2012/0315578 A1   12/2012  Lee et al.
2014/0027060 A1    1/2014  Ranish et al.
2014/0051258 A1*  2/2014  Izumoto ............ H01L 21/67086
                                                       156/345.23
2014/0105582 A1*  4/2014  Tallavarjula ............. B23Q 3/18
                                                         392/416

* cited by examiner

BAKING CHAMBER WITH SHROUD FOR MASK CLEAN

FIELD

Embodiments of the present disclosure generally relate to substrate processing equipment.

BACKGROUND

Substrates for use in the semiconductor manufacturing industry are often cleaned to remove unwanted materials such as contaminants or other unwanted particles generated thereon during processing. Substrates may include semiconductor wafer, chamber components, photomasks, or the like. After undergoing a wet clean or a dry clean process, the substrate may include leftover moisture, residue, or haze. Baking chambers may be used to remove the leftover moisture, unwanted particles, or haze from the substrate. However, heating parts and materials around heating parts in typical baking chambers can be oxidized to create defects, or high temperatures can shed particles from surfaces of the heating parts due to thermal stress, contaminating the substrate.

Accordingly, the inventors have provided improved baking chambers for cleaning substrates.

SUMMARY

Embodiments of baking chambers and methods of use thereof are provided herein. In some embodiments, a baking chamber for baking a substrate includes: a chamber body enclosing an interior volume; a heater disposed in the interior volume, wherein the heater is configured to have a surface temperature of about 100 to about 400 degrees Celsius during use; a shroud disposed in the interior volume opposite the heater, wherein the shroud includes a central opening fluidly coupled to a gas inlet; a plurality of substrate lift pins configured to support a substrate in the interior volume between the heater and the shroud such that the heater heats the substrate via convection, wherein the shroud includes a plurality of first openings to facilitate the plurality of substrate lift pins; and a gas outlet disposed in the chamber body opposite the shroud such that a gas flow path through the interior volume extends from the gas inlet, to a region within the shroud, around the heater, and to the gas outlet.

In some embodiments, a baking chamber for baking a photomask includes: a chamber body enclosing an interior volume; a heater disposed in the interior volume, wherein the heater is configured to have a surface temperature of about 100 to about 400 degrees Celsius during use; a shroud disposed in the interior volume opposite the heater, wherein the shroud has a conical shape and includes a central opening fluidly coupled to a gas inlet; a plurality of substrate lift pins configured to support the photomask in the interior volume between the heater and the shroud such that the heater heats the photomask via convection, wherein the shroud includes a plurality of first openings to facilitate the plurality of substrate lift pins; and a gas outlet disposed in the chamber body opposite the shroud such that a gas flow path through the interior volume extends from the gas inlet, to a region within the shroud, around the heater, and to the gas outlet.

In some embodiments, a method of baking a substrate in a baking chamber, includes: placing a substrate on a plurality of substrate lift pins in an interior volume of the baking chamber between a heater and a shroud having central opening coupled to a gas inlet; flowing an inert gas to the gas inlet such that the inert gas flows from the gas inlet to a region within the shroud, around the substrate, around the heater, and to a gas outlet on a side of the baking chamber opposite the gas inlet; baking the substrate via convection using the heater to dissociate residue on the substrate; and exhausting the residue via the gas outlet.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
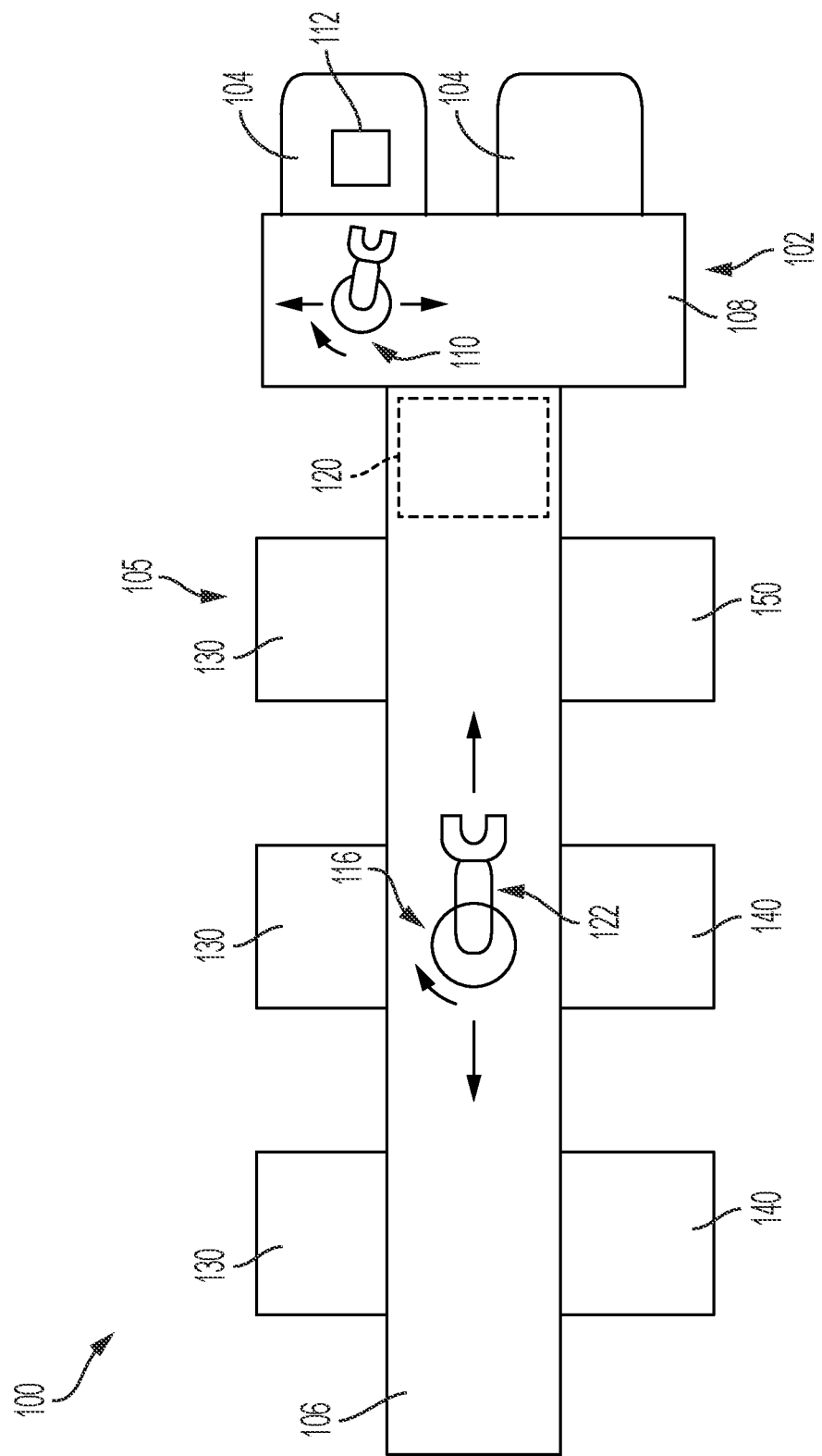
FIG. 1 depicts a schematic view of a multi-chamber processing tool having a baking chamber in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of baking chambers for baking substrates are provided herein. The baking chambers are configured to heat the substrates to remove unwanted particles or residue after the substrates undergo a wet clean or a dry clean process. The substrates may be, for example, semiconductor wafers, photomasks, or the like. In the example of the photomasks, ammonium sulfate residue, or haze, may be left on the photomask after a wet clean or dry dean process. Heating the photomask to about 70 to about 150 deg Celsius causes the ammonium sulfate residue to dissociate from the photomask.

The dissociated residue may then be removed from an interior volume of the baking chamber. The baking chambers provided herein advantageously include a shroud in the interior volume to direct inert gas to a region proximate a surface of the substrate having the residue to dilute other unwanted gas particles in the region. Diluting the region of unwanted gas particles advantageously allows the substrates to be heated at atmospheric pressure via convection heating rather than radiation heating, while minimizing unwanted reactions between the residue and the unwanted gas particles. Heating via convection allows for heaters in the baking chamber to operate at lower surface temperatures (e.g., about 100 to about 400 degrees Celsius), advantageously reducing shedding of particles from the heaters.

FIG. 1 depicts a schematic view of a multi-chamber processing tool (tool) 100 having a baking chamber 150 in accordance with at least some embodiments of the present disclosure. The tool 100 generally includes a factory interface 102, a transfer chamber 106 coupled to the factory interface 102, and a plurality of process chambers 105, including the baking chamber 150 coupled to the transfer chamber 106. The factory interface 102 includes a plurality of loadports 104 for receiving one or more substrates 112. The one or more substrates 112 may be semiconductor wafers, carrier substrates, photomasks, or the like. In some embodiments, the plurality of loadports 104 are arranged along a common side of the factory interface 102. A factory interface robot 110 may be disposed in an interior volume 108 of the factory interface 102 to shuttle or transport the one or more substrates 112 from the plurality of loadports 104 to the transfer chamber 106. The factory interface robot 110 may be configured for rotational movement within the interior volume 108, lateral movement within the interior volume 108, or both.

The transfer chamber 106 is coupled to the factory interface 102, and in some embodiments, is disposed on a side of the factory interface 102 opposite the plurality of loadports 104. The transfer chamber 106 includes a transfer robot 116 disposed therein for shuttling the one or more substrates 112 received from the factory interface robot 110 to the one or more process chambers 105 coupled to the transfer chamber. The transfer robot 116 may be configured for rotational movement, lateral movement, or both. For example, lateral movement may be achieved via rails on a floor of the transfer chamber 106 or via wheels or tracks under the transfer robot 116. An arm 122 of the transfer robot 116 may expand and contract to move the one or more substrates 112 into and out of respective chambers of the plurality of process chambers 105.

In some embodiments, the transfer robot 116 is configured to directly receive the one or more substrates 112 from the factory interface robot 110. In some embodiments, the transfer robot 116 is configured to indirectly receive the one or more substrates 112 from the factory interface robot 110. For example, in some embodiments, one of the factory interface 102 or the transfer chamber 106 includes a buffer 120 configured to hold one or more of the one or more substrates 112. The transfer robot 116 may be configured to transfer the one or more substrates 112 to the buffer 120 and the transfer robot 116 may be configured to transfer the one or more substrates 112 from the buffer 120 to the plurality of process chambers 105 and from the plurality of process chambers 105 back to the buffer 120.

The transfer chamber 106 may have one or more environmental controls. For example, an airflow opening in the transfer chamber 106 may include a filter to filter the airflow entering the transfer chamber 106. Other environmental controls may include one or more of humidity control, static control, temperature control, or pressure control.

The one or more process chambers 105 may be coupled orthogonally to the transfer chamber 106 or may be coupled at an angle with respect to the transfer chamber 106. The plurality of process chambers 105 may be sealingly engaged with the transfer chamber 106. The transfer chamber 106 generally operates at atmospheric pressure but may be configured to operate at vacuum pressure. The plurality of process chambers 105 are configured to perform one or more processing steps to one or more substrates 118 being processed in the tool 100. For example, the plurality of process chambers 105 may comprise one or more wet clean chambers 130 (three shown in FIG. 1) configured to clean the one or more substrates 112 with a liquid, for example, water. The plurality of process chambers 105 may comprise one or more dry clean chambers 140 (two shown in FIG. 1) configured to perform a dry clean process on the one or more substrates 112, for example, via a plasma etch or plasma ashing procedure. The one or more process chambers 105 includes at least one baking chamber, for example, the baking chamber 150 configured to heat the one or more substrates to remove residue or haze left over after the wet clean or dry clean process. In some embodiments, the one or more wet clean chambers 130 are disposed on a side of the transfer chamber 106 different than the one or more dry clean chambers 140.

Figure 2A:
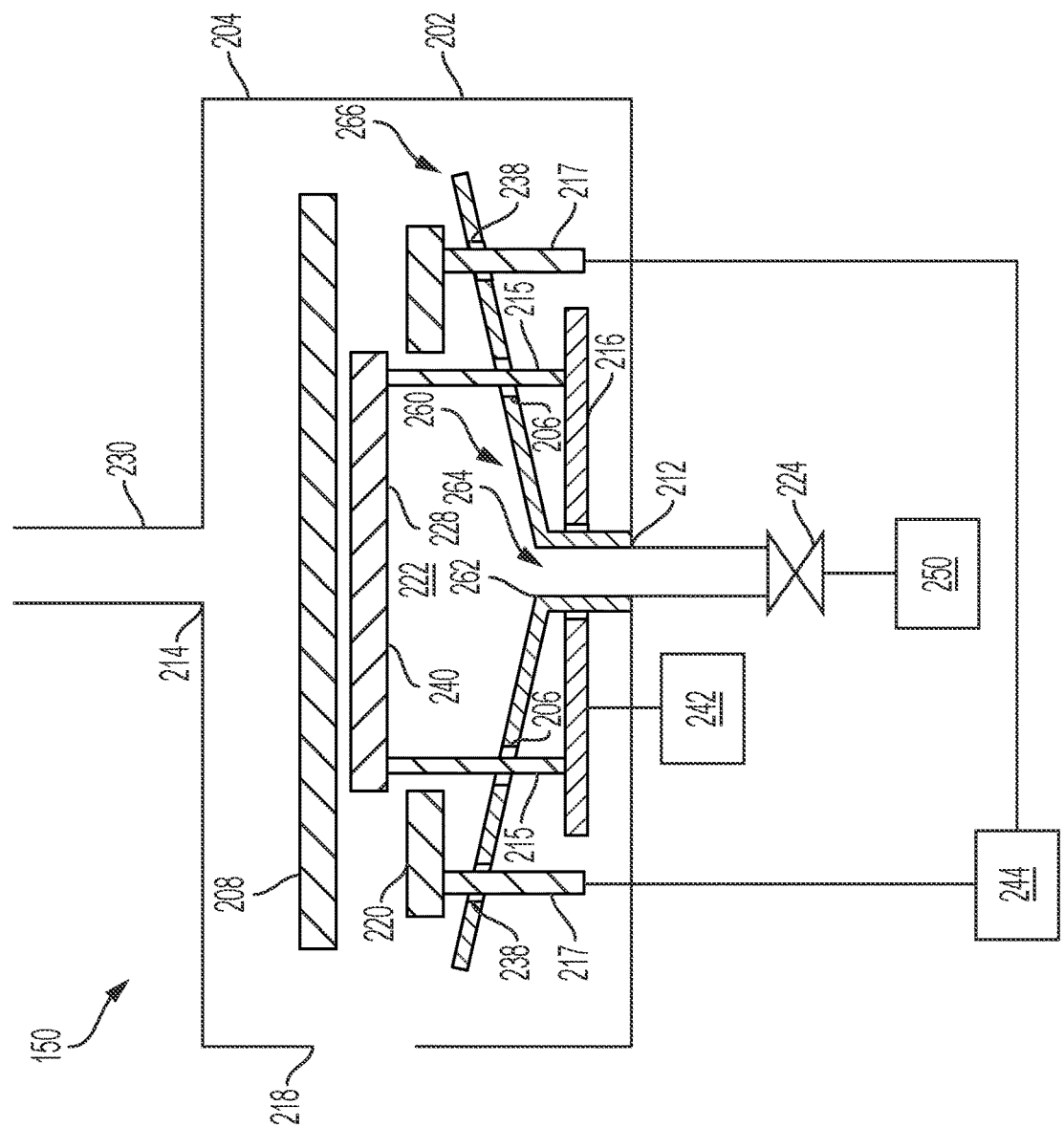
FIG. 2A depicts a schematic cross-sectional side view of a baking chamber in a transfer position in accordance with at least some embodiments of the present disclosure.
Figure 2B:
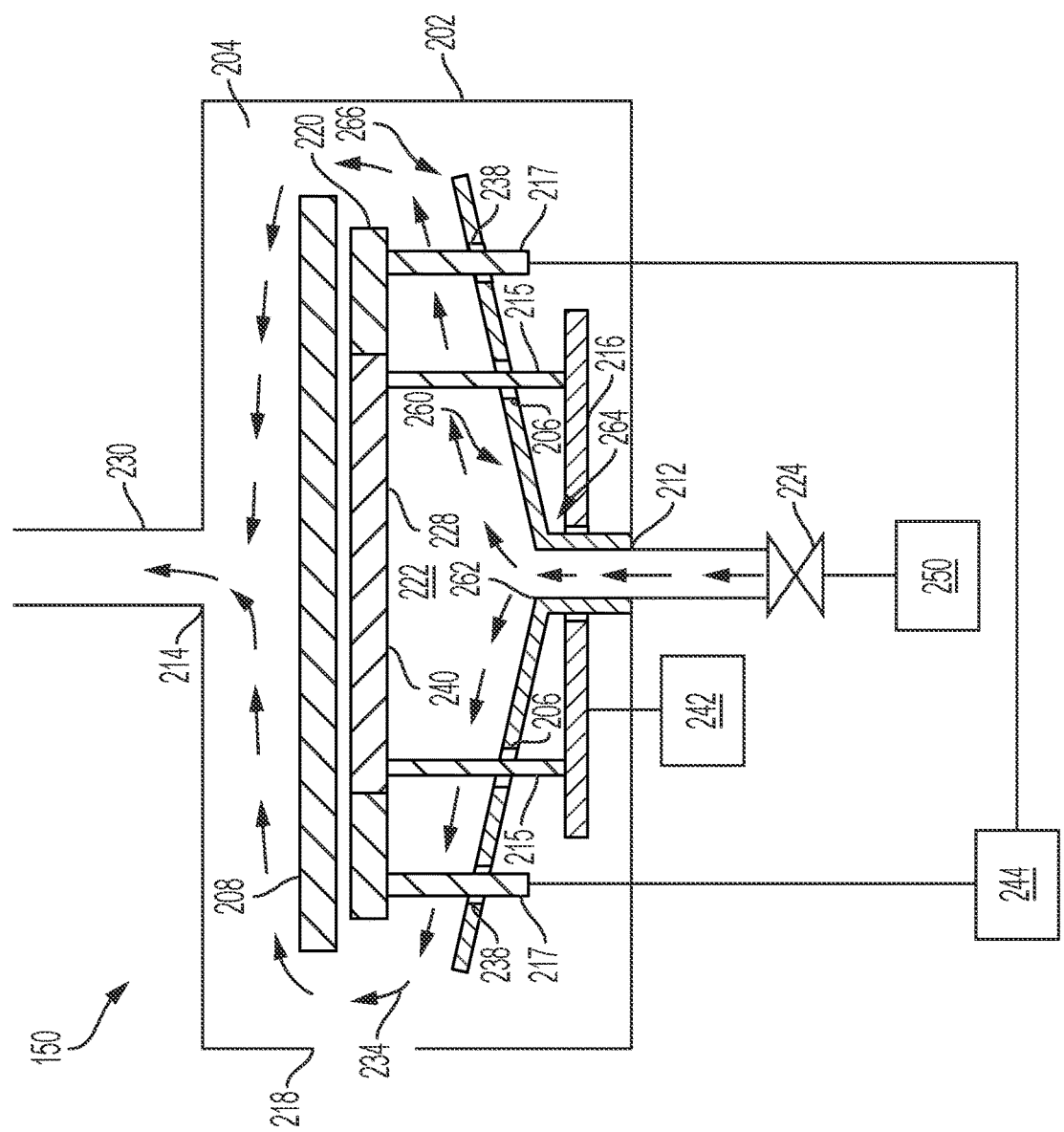
FIG. 2B depicts a schematic cross-sectional side view of a baking chamber in a processing position in accordance with at least some embodiments of the present disclosure.

FIGS. 2A and 2B depict a schematic cross-sectional side view of a baking chamber 150 in a transfer position and a processing position, respectively, in accordance with at least some embodiments of the present disclosure. The baking chamber 150 may be part of a multi chamber process tool such as tool 100, or a standalone chamber. The baking chamber 150 generally comprises a chamber body 202 enclosing an interior volume 204. In some embodiments, the interior volume 204 is configured to operate at non-vacuum, or atmospheric, pressure. The chamber body 202 may be made of a metal, such as aluminum or stainless steel.

A heater 208 is disposed in the interior volume 204. In some embodiments, a surface temperature of the heater 208 is about 100 to about 400 degrees Celsius during use. In some embodiments, the heater 208 comprises a hot plate including one or more resistive heating elements. In some embodiments, the heater 208 comprises one or more infrared (IR) lamps arranged in a suitable pattern. In some embodiments, the heater 208 is configured to heat the substrate 240 to about 70 to about 150 degrees.

In some embodiments, a gas inlet 212 and a gas outlet 214 are coupled to the interior volume 204 to flow an inert gas through the interior volume 204. The gas inlet 212 and the gas outlet 214 are disposed on opposite sides of the chamber body 202 and configured to flow the inert gas across the heater 208. In some embodiments, the gas outlet 214 is disposed vertically above the gas inlet 212. For example, as shown in FIG. 2A, the gas inlet 212 is disposed in a floor of the baking chamber 150 and the gas outlet 214 is disposed in a ceiling of the baking chamber 150. In some embodiments, the gas inlet 212 may be disposed in the ceiling of the baking chamber 150 and the gas outlet 214 may be disposed in the floor of the baking chamber 150. The gas inlet 212 is coupled to a gas supply 250 that consists essentially of an inert gas. In some embodiments, the gas supply 250 comprises at least about 99.999% of an inert gas. In some embodiments, the inert gas comprises nitrogen, argon, or the like. In some embodiments, the inert gas comprises a mixture of inert gases. In some embodiments, a gas inlet valve 224 is disposed between the gas inlet 212 and the gas supply 250 for selectively flowing the inert gas into the interior volume 204. The gas outlet 214 is fluidly coupled to an exhaust line 230.

A shroud 260 is disposed in the interior volume 204 opposite the heater 208. The shroud 260 generally includes a narrow lower end 264 having a central opening 262 fluidly coupled to the gas inlet 212. In some embodiments, the shroud 260 extends radially outward from the narrow lower end 264 to a wider upper end 266. In some embodiments, the shroud 260 has an inverted conical shape or inverted pyramid shape. In some embodiments, the shroud 260 has a bowl shape. In some embodiments, the gas outlet 214 is disposed in the chamber body 202 opposite the shroud 260 such that a gas flow path 234 through the interior volume 204 extends from the gas inlet 212, to a region 222 within the shroud 260, around the heater 208, and to the gas outlet 214.

A plurality of substrate lift pins 215 are disposed in the interior volume 204 and configured to support a substrate 240 in the interior volume 204 between the heater 208 and the shroud 260 such that heat from the heater 208 can impinge upon the substrate 240 via convection. In some embodiments, an outer diameter of the heater 208 is greater than an outer diameter or a width of the substrate 240. The substrate 240 may be one of the one or more substrates 112 of FIG. 1. In some embodiments, the plurality of substrate lift pins 215 are configured to support the substrate 240 about 1 mm to about 3 mm from the heater 208. In some embodiments, the shroud 260 includes a plurality of first openings 206 to facilitate the plurality of substrate lift pins 215. wherein the plurality of substrate lift pins are coupled to a platform for raising or lowering the plurality of substrate lift pins in unison.

In some embodiments, a plurality of edge ring lift pins 217 are disposed in the interior volume 204 to support an edge ring 220 when disposed thereon. The edge ring 220 is configured to surround the substrate 240 to enhance temperature uniformity of the substrate 240 when heated. In some embodiments, the plurality of edge ring lift pins 217 extend through a plurality of second openings 238 in the shroud 260. In some embodiments, the plurality of edge ring lift pins 217 are disposed radially outward of the plurality of substrate lift pins 215. In some embodiments, the plurality of substrate lift pins 215 comprise four lift pins. In some embodiments, the plurality of edge ring lift pins 217 comprise four lift pins.

In some embodiments, one or more first lift mechanisms 242 are coupled to the plurality of substrate lift pins 215 and configured to raise or lower the substrate 240 in the interior volume 204. In some embodiments, one or more second lift mechanisms 244 are coupled to the plurality of edge ring lift pins 217 and configured to raise or lower the edge ring 220. In some embodiments, the plurality of substrate lift pins 215 are coupled to a platform 216 and the one or more first lift mechanisms 242 comprise a single first lift mechanism configured to raise or lower the platform 216 so that the substrate lift pins are raised or lowered in unison. In some embodiments, each of the plurality of substrate lift pins 215 are coupled to respective ones of the one or more first lift mechanisms 242 to independently control the raising or lowering of each of the plurality of substrate lift pins 215. Similarly, the plurality of edge ring lift pins 217 may be configured for independent control or controlled in unison via a single second lift mechanism.

Figure 3:
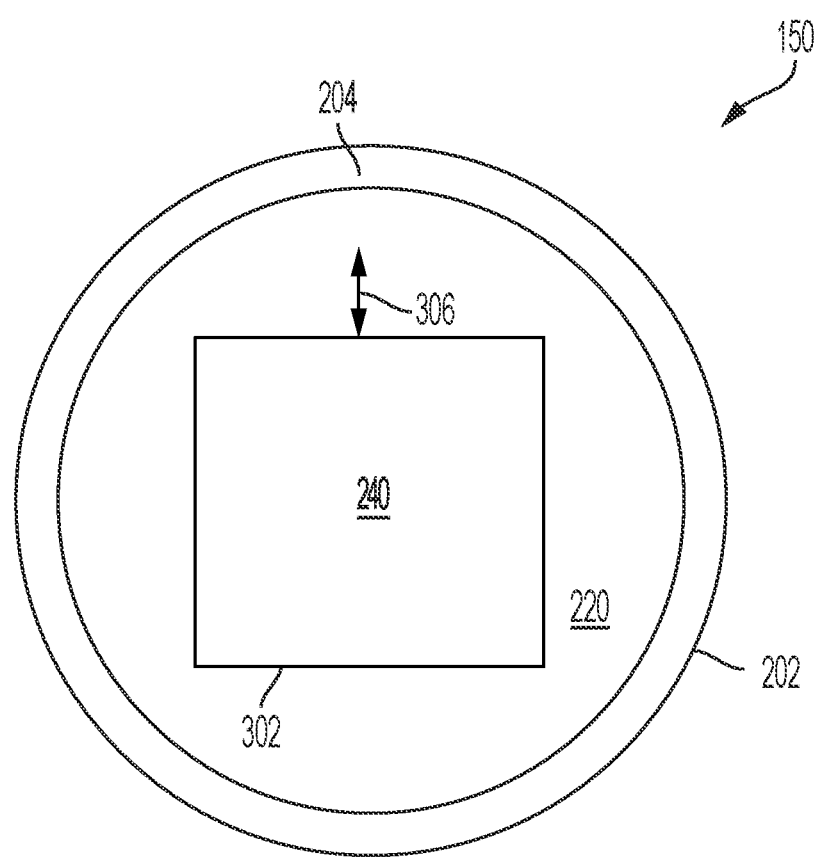
FIG. 3 depicts a schematic top view of an interior volume of a baking chamber in accordance with at least some embodiments of the present disclosure.

FIG. 3 depicts a schematic top view of the interior volume 204 of a baking chamber 150 in accordance with at least some embodiments of the present disclosure. In some embodiments, the chamber body 202 has a circular shape from a top view of baking chamber 150. In some embodiments, the substrate 240 is a photomask having a square shape. In some embodiments, the edge ring 220 has a central opening 302 to accommodate the substrate 240 therein. In some embodiments, the edge ring 220 has a square shape. In some embodiments, the central opening 302 is square. In some embodiments, as shown in FIG. 3, the edge ring 220 has a round shape with a central opening 302 that is square. In some embodiments, the edge ring 220 has a width 306 from an outer sidewall of the edge ring 220 to the central opening 302 of about 1.5 inches to about 3.0 inches. The edge ring 220 extends a baking surface of the substrate 240, advantageously promoting temperature uniformity across the substrate 240. In some embodiments, a thickness of the edge ring 220 is similar to a thickness of the substrate 240. In some embodiments, the edge ring 220 is made of a similar or same material as the substrate 240. In some embodiments, an outer diameter of the heater 208 is greater than an outer diameter of the edge ring 220.

Figure 4:
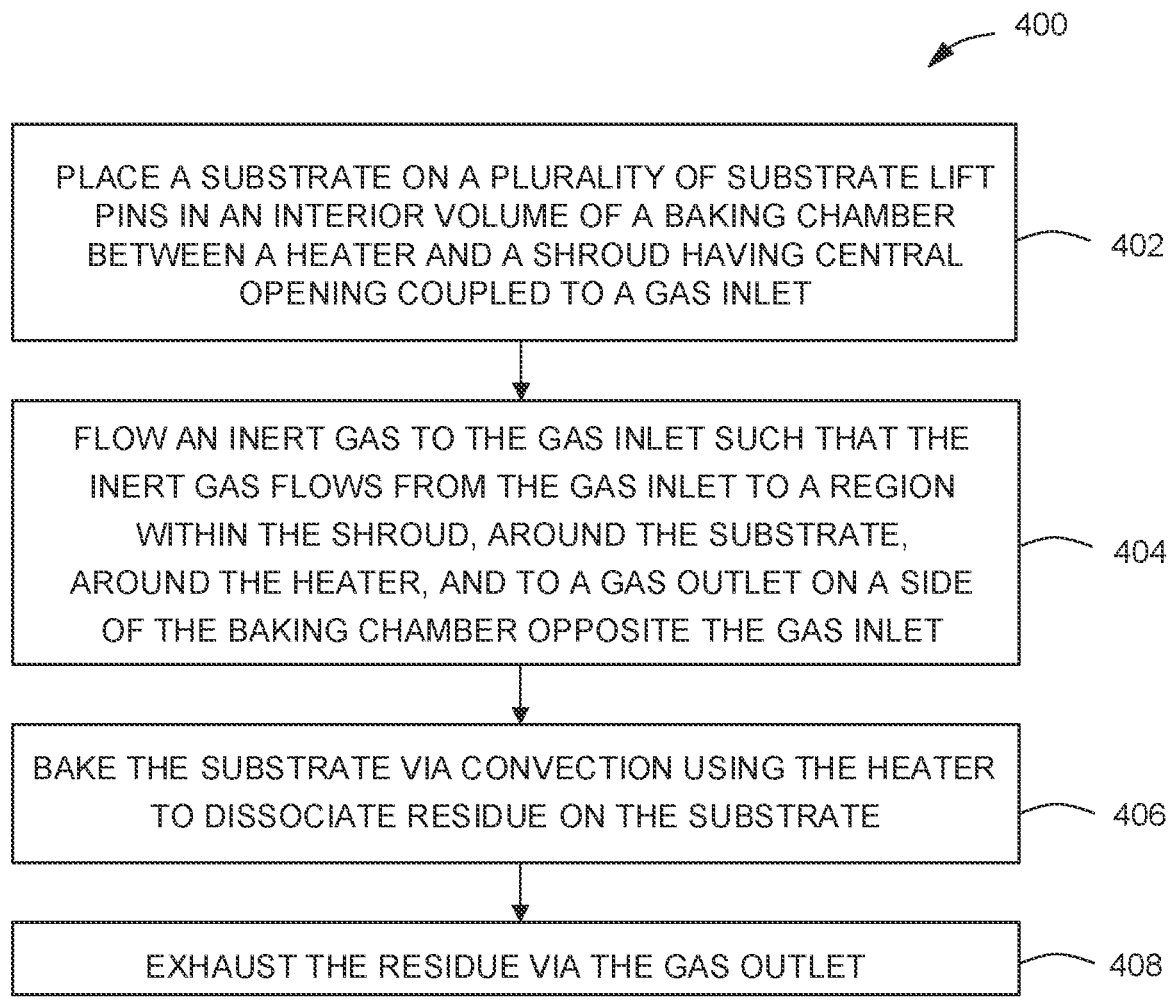
FIG. 4 depicts a flow chart of a method of baking a substrate in a baking chamber in accordance with at least some embodiments of the present disclosure.

FIG. 4 depicts a flow chart of a method 400 of baking a substrate (e.g., substrate 240) in a baking chamber (e.g., baking chamber 150) in accordance with at least some embodiments of the present disclosure. At 402, the method 400 includes placing the substrate on a plurality of substrate lift pins (e.g., plurality of substrate lift pins 215) in an interior volume (e.g., interior volume 204) of the baking chamber between a heater (e.g., heater 208) and a shroud (e.g., shroud 260) having central opening coupled to a gas inlet (e.g., gas inlet 212). The substrate may be placed into the baking chamber via a transfer slot (e.g., transfer slot 218). The substrate may be placed into the baking chamber manually or via a transfer robot (e.g., transfer robot 116). In some embodiments, the substrate is a photomask.

At 404, the method 400 includes flowing an inert gas to the gas inlet such that the inert gas flows from the gas inlet to a region (e.g., region 222) within the shroud, around the substrate, around the heater, and to a gas outlet (e.g., gas outlet 214) on a side of the baking chamber opposite the gas inlet. Flowing the inert gas through the region within the shroud dilutes or pushes out unwanted particles from proximate a residue surface (e.g., residue surface 228) of the substrate. The unwanted particles may comprise one or more of oxygen gas, water vapor, sulfur dioxide, or ammonium, which may react with the residue. In some embodiments, the baking chamber is configured to dilute unwanted particles from the region within the shroud and configured to keep unwanted particles in regions outside of the shroud.

In some embodiments, the substrate may be placed within a central opening (e.g., central opening 302) of an edge ring (e.g., edge ring 220) before flowing the inert gas. In some embodiments, the edge ring is supported by a plurality of edge ring lift pins (e.g., plurality of edge ring lift pins 217). In some embodiments, the edge ring is lowered to a transfer position by lowering the plurality of edge ring lift pins before placing the substrate on the plurality of substrate lift pins. In some embodiments, the plurality of substrate lift pins are raised with respect to the plurality of edge ring lift pins before placing the substrate on the plurality of substrate lift pins.

At 406, the method 300 includes baking the substrate via convection using a heater (e.g., heater 208) disposed in the interior volume of the baking chamber to dissociate residue on the substrate. In some embodiments, an atmospheric pressure is maintained in the interior volume during baking. In some embodiments, baking the substrate comprises heating the substrate to a temperature of about 70 to about 150 degrees Celsius. In some embodiments, the baking time may be about 1 minutes to about 15 minutes.

At 408, the method 400 includes exhausting the residue that dissociates from the substrate via the gas outlet. Once baking is complete, the substrate may be removed from the baking chamber via the transfer slot. In some embodiments, the edge ring may be lowered prior to removing the substrate from the baking chamber. In some embodiments, the substrate may be raised prior to removing the substrate from the baking chamber.

While the foregoing is directed to embodiments of the present disclosure, other and further embodiments of the disclosure may be devised without departing from the basic scope thereof.

The invention claimed is:

1. A baking chamber for baking a substrate, comprising:
a chamber body enclosing an interior volume;
a heater disposed in the interior volume;
a shroud disposed in the interior volume opposite the heater, wherein the shroud includes a central opening fluidly coupled to a gas inlet;
a plurality of substrate lift pins configured to support a substrate in the interior volume between the heater and the shroud such that the heater heats the substrate via convection, wherein the shroud includes a plurality of first openings to facilitate movement of the plurality of substrate lift pins through the shroud;
a gas outlet disposed in the chamber body opposite the shroud such that a gas flow path through the interior volume extends from the gas inlet, to a region within the shroud, around the heater, and to the gas outlet; and
an edge ring disposed on a plurality of edge ring lift pins and configured to surround the substrate, wherein the plurality of edge ring lift pins extend through a plurality of second openings in the shroud.

2. The baking chamber of claim 1, wherein the substrate is a photomask and the edge ring has a square central opening.

3. The baking chamber of claim 1, wherein the plurality of substrate lift pins are coupled to a platform for raising or lowering the plurality of substrate lift pins in unison.

4. The baking chamber of claim 1, wherein the heater comprises a hot plate including one or more resistive heating elements.

5. The baking chamber of claim 1, wherein the plurality of substrate lift pins are configured to support the substrate such that the substrate is 1 mm to 3 mm from the heater.

6. The baking chamber of claim 1, wherein the shroud has an inverted conical shape or inverted pyramid shape.

7. The baking chamber of claim 1, wherein the gas outlet is disposed vertically above the gas inlet.

8. The baking chamber of claim 1, further comprising a gas supply comprising essentially of an inert gas coupled to the gas inlet.

9. A baking chamber for baking a photomask, comprising:
a chamber body enclosing an interior volume;
a heater disposed in the interior volume;
a shroud disposed in the interior volume opposite the heater, wherein the shroud has a conical shape and includes a central opening fluidly coupled to a gas inlet;
a plurality of substrate lift pins configured to support the photomask in the interior volume between the heater and the shroud such that the heater heats the photomask via convection, wherein the shroud includes a plurality of first openings to facilitate movement of the plurality of substrate lift pins through the shroud;
a gas outlet disposed in the chamber body opposite the shroud such that a gas flow path through the interior volume extends from the gas inlet to a region within the shroud, around the heater, and to the gas outlet; and
an edge ring disposed on a plurality of edge ring lift pins and configured to surround the substrate, wherein the plurality of edge ring lift pins extend through a plurality of second openings in the shroud.

10. The baking chamber of claim 9, wherein the heater has an outer diameter greater than a width of the photomask.

11. The baking chamber of claim 9, wherein the heater is configured to heat the photomask to 70 to 150 degrees.

12. The baking chamber of claim 9, wherein the edge ring includes a square central opening.

13. The baking chamber of claim 12, wherein the edge ring has a width from an outer sidewall of the edge ring to the central opening of 1.5 inches to 3.0 inches.

14. The baking chamber of claim 9, wherein the plurality of substrate lift pins comprise four lift pins.

15. A method of baking a substrate in the baking chamber of claim 1, comprising:
placing the substrate on the plurality of substrate lift pins in the interior volume of the baking chamber between the heater and the shroud;
flowing an inert gas to the gas inlet such that the inert gas flows from the gas inlet to a region within the shroud, around the substrate, around the heater, and to the gas outlet on a side of the baking chamber opposite the gas inlet;
baking the substrate via convection using the heater to dissociate residue on the substrate; and
exhausting the residue via the gas outlet.

16. The method of claim 15, wherein baking the substrate comprises heating the substrate to a temperature of 70 to 150 degrees Celsius.

17. The method of claim 15, further comprising maintaining an atmospheric pressure in the interior volume during baking.

18. The method of claim 15, further comprising placing the substrate within a central opening of the edge ring before flowing the inert gas.

19. The method of claim 18, wherein the edge ring is supported by the plurality of edge ring lift pins and further comprising lowering the edge ring to a transfer position before placing the substrate on the plurality of substrate lift pins.

* * * * *